United States Patent
Buynoski et al.

(10) Patent No.: US 6,376,343 B1
(45) Date of Patent: Apr. 23, 2002

(54) REDUCTION OF METAL SILICIDE/SILICON INTERFACE ROUGHNESS BY DOPANT IMPLANTATION PROCESSING

(75) Inventors: Matthew S. Buynoski, Palo Alto, CA (US); Paul R. Besser, Austin, TX (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/812,695

(22) Filed: Mar. 21, 2001

Related U.S. Application Data (60) Provisional application No. 60/268,677, filed on Feb. 15, 2001.

(51) Int. Cl.$^7$ ............................................. H01L 21/425
(52) U.S. Cl. ...................... 438/529; 438/303; 438/682; 257/607; 257/611; 257/768
(58) Field of Search ................. 438/682, 529, 438/303; 257/607, 611, 768

(56) References Cited

U.S. PATENT DOCUMENTS

| | | | |
|---|---|---|---|
| 4,879,254 A | * 11/1989 | Tsuzuki et al. | 437/41 |
| 5,956,588 A | * 9/1999 | Choi et al. | 438/286 |
| 6,162,689 A | * 12/2000 | Kepler et al. | 438/299 |
| 6,255,214 B1 | * 7/2001 | Wieczorek et al. | 438/659 |

OTHER PUBLICATIONS

T. Morimoto et al., "Self–Aligned Nickel–Mono–Silicide Technology for High–Speed Deep Submicrometer Logic CMOS ULSI," IEEE Transactions on Electron Devices, vol. 42, No. 5, May 1995, pp. 915–922.*

* cited by examiner

*Primary Examiner*—Charles Bowers
*Assistant Examiner*—Stephen W. Smoot (57) ABSTRACT

Deleterious roughness of metal silicide/doped Si interfaces arising during conventional salicide processing for forming shallow-depth source and drain junction regions of MOS transistors and/or CMOS devices due to poor compatibility of particular dopants and metal suicides is avoided, or at least substantially reduced, by implanting a first (main) dopant species having relatively good compatibility with the metal silicide, such that the maximum concentration thereof is at a depth above the depth to which silicidation reaction occurs and implanting a second (auxiliary) dopant species having relatively poor compatibility with the metal silicide, wherein the maximum concentration thereof is less than that of the first (main) dopant and is at a depth below the depth to which silicidation reaction occurs. The invention enjoys particular utility in forming NiSi layers on As-doped Si substrates.

20 Claims, 4 Drawing Sheets

REDUCTION OF METAL SILICIDE/SILICON INTERFACE ROUGHNESS BY DOPANT IMPLANTATION PROCESSING

CROSS-REFERENCE TO PROVISIONAL APPLICATION

This application claims priority from U.S. provisional patent application Ser. No. 60/268,677, filed Feb. 15, 2001, the entire disclosure of which is incorporated herein by reference.

CROSS-REFERENCE TO RELATED APPLICATIONS

This application contains subject matter similar to subject matter disclosed in co-pending U.S. patent applications Ser. No. 09/819,598, filed on Mar. 29, 2001 and Ser. No. 09/813,308, filed on Mar. 21, 2001.

FIELD OF THE INVENTION

The present invention relates to a method of manufacturing semiconductor devices, e.g., high-density integrated circuit ("IC") semiconductor devices exhibiting reliable, high quality, adherent, low resistance, well-aligned contacts to source, drain, and gate regions of active devices, such as MOS and CMOS transistors formed in or on a semiconductor substrate, by utilizing self-aligned, metal silicide ("salicide") processing methodology. The present invention enjoys particular utility in the manufacture of high-density integration semiconductor devices, including multi-level devices, having design rules of 0.18 µm and below, e.g., 0.15 µm and below.

BACKGROUND OF THE INVENTION

The escalating requirements for high density and performance associated with ultra-large scale integration (ULSI) devices necessitate design rules of 0.18 µm and below, such as 0.15 µm and below, with increased transistor and circuit speeds, high reliability, and increased manufacturing throughput. The reduction in feature sizes, e.g., of source, drain, and gate regions of transistors formed in or on a common semiconductor substrate, challenges the limitations of conventional contact and interconnection technology, including conventional photo-lithographic, etching, and deposition techniques.

As a result of the ever-increasing demand for large-scale and ultra small-dimensioned IC devices, self-aligned techniques have become the preferred technology for forming such devices in view of their simplicity and capability of high-density integration. As device dimensions decrease in the deep sub-micron range, both vertically and laterally, many problems arise, especially those caused by an increase in the sheet resistance of the contact areas to the source and drain regions and junction leakage as junction layer thickness decreases. To overcome this problem, the use of self-aligned, highly electrically conductive metal silicides, i.e., "salicides" (derived from Self-ALIgned-siliCIDE), has become commonplace in the manufacture of IC semiconductor devices comprising, e.g., MOS type transistors. Another technique employed in conjunction with metal silicide technology is the use of, shallow-depth source and drain extensions formed just at the edge of the gate region, while more heavily-doped source and drain regions, to which ohmic contact is to be provided, are laterally displaced away from the gate by provision of sidewall spacers on opposing sides of the gate electrode. Salicide processing involves deposition of a metal that forms an intermetallic compound with silicon (Si), but does not react with silicon oxides, nitrides, or oxynitrides under normal processing conditions. Metals commonly employed in salicide processing include platinum (Pt), titanium (Ti), nickel (Ni), and cobalt (Co), each of which forms very low resistivity phases with Si, e.g., $PtSi_2$, $TiSi_2$, NiSi, and $CoSi_2$. In practice, the metal is deposited in a uniform thickness over all exposed surface features of a Si wafer, preferably by means of physical vapor deposition ("PVD") process, e.g., sputtering from an ultra-pure target utilizing an ultra-high vacuum, multi-chamber DC magnetron sputtering system. In MOS transistor formation, deposition is generally performed both after gate etch and after source/drain formation. After deposition, the metal layer blankets the top surface of the gate electrode, typically formed of a heavily-doped polysilicon, the silicon oxide, nitride, or oxynitride sidewall spacers on the opposing side surfaces of the gate electrode, the silicon oxide isolation regions formed in the Si substrate between adjacent active device regions, and the exposed surfaces of the substrate where the source and drain regions are to be formed or will subsequently be formed. As a result of thermal processing, e.g., a rapid thermal annealing ("RTA"), the metal layer reacts with underlying Si to form electrically conductive metal silicide layer portions on the top surface of the polysilicon gate electrode and on the exposed surfaces of the substrate where source and drain regions are or will be formed. Unreacted portions of the metal layer, e.g., on the silicon oxide, nitride, or oxynitride sidewall spacers and the silicon oxide isolation regions, are then removed, as by a wet chemical etching process selective to the metal silicide portions. In some instances, e.g., with Co, a first RTA step may be performed at a relatively lower temperature in order to form first-phase CoSi, which is then subjected to a second RTA step performed at a relatively high temperature to convert the first-phase CoSi to second-phase, lower resistivity $CoSi_2$.

A number of different techniques and fabrication processes have been either proposed or utilized for forming MOS transistors and/or CMOS devices according to salicide methodology. Referring to FIGS. 1(A)–1(I), shown therein, for illustrative purposes only, is an example of a typical salicide-based process according to conventional processing technology. In a preliminary step, shown in FIG. 1(A), a silicon (Si) or Si-based substrate 102, typically a monocrystalline Si wafer of one conductivity type (p or n) or comprising a well region of one conductivity type formed therein, is processed, as by conventional techniques such as formation of field oxide regions, local oxidation of silicon ("LOCOS"), shallow trench isolation ("STI"), etc., to define a plurality of electrically separated regions. In the illustrated embodiment, shallow isolation trenches 216 (only one is shown for illustrative simplicity) are formed in a surface portion of substrate 102, as by isotropic etching utilizing wet chemical etching techniques or by anisotropic etching utilizing dry etching techniques, e.g., reactive plasma etching. Trenches 216 are then filled with an oxide 218 layer, such that an edge 220 of the oxide 218 contacts the substrate 102 at locations where doped regions will subsequently be formed within the substrate 102. (Trench 216 and oxide layer 218 are not shown in the following drawing figures for illustrative simplicity).

Figure 1A:
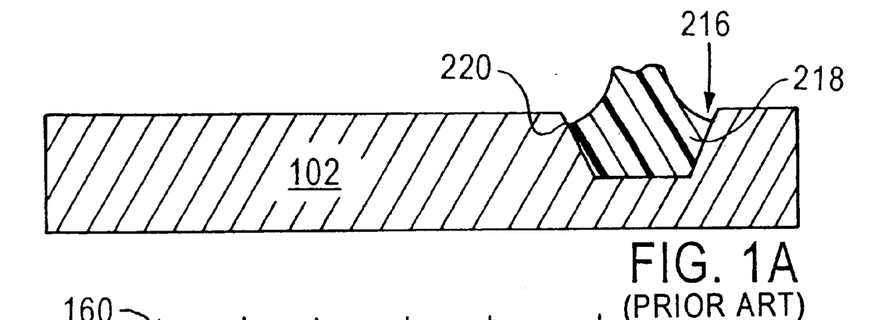
FIGS. 1(A)–1(I) are schematic, simplified, cross-sectional views illustrating stages in the formation of a MOS transistor according to conventional methodology.
Figures 1B, 1C:
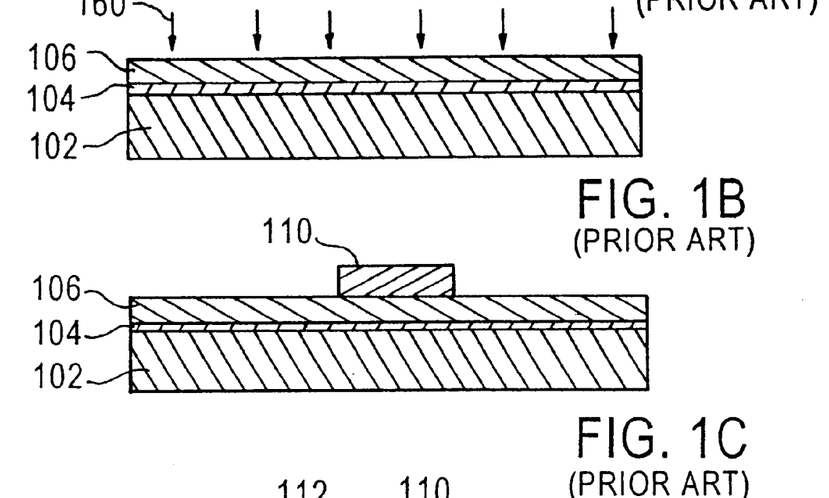

Referring now to FIG. 1(B), a thin gate oxide (insulator) layer 104, typically a silicon oxide layer about 15–50 Å thick, is formed on the upper surface of substrate 102, e.g., by thermal oxidation at temperatures of from about 700 to about 1,000° C. in an oxidizing atmosphere. After formation of the gate oxide layer 104, a blanket layer of undoped polysilicon 106 is deposited on the gate oxide layer 104, for example, by low pressure chemical vapor deposition ("LPCVD"). If desired, polysilicon layer 106 can be treated to retard diffusion of boron (B) atoms therethrough, as by implantation with nitrogen ($N_2$) ions, symbolically indicated in the figure by arrows 160.

Figure 1D:
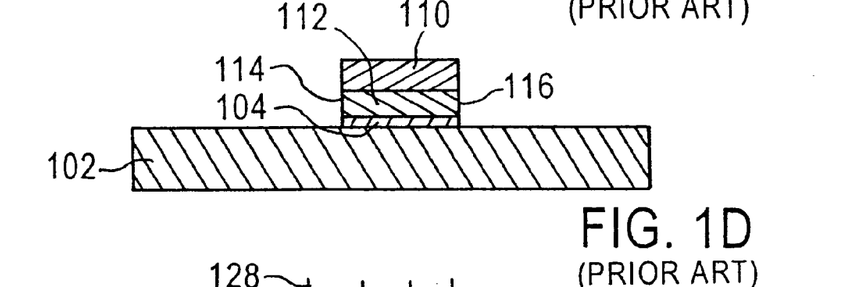

Adverting to FIG. 1(C), a continuous photoresist layer 110 is then deposited on the polysilicon layer 106, and the photoresist layer 110 is selectively irradiated utilizing photolithographic masking techniques and developed, followed by removal of the selectively irradiated portions thereof to expose portions of the polysilicon layer 106 which are to be removed to define a gate electrode. As shown in FIG. 1(D), the exposed portions of polysilicon layer 106 and the respective underlying portions of the thin gate oxide layer 104 are removed, as by anisotropic etching, to form polysilicon gate electrode 112 having vertically opposed sidewalls or edges 114, 116.

Figure 1E:
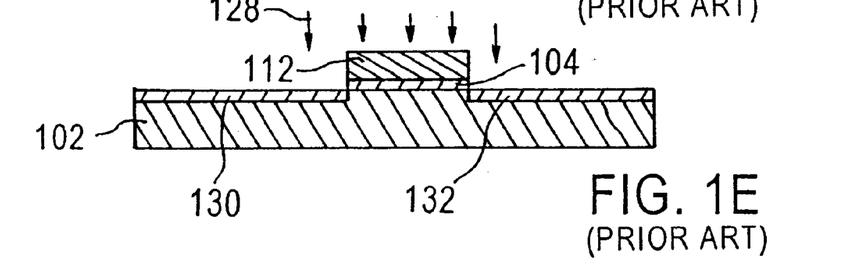

With reference to FIG. 1(E), the remaining portion of the photoresist layer 110 is then stripped from the upper surface of the polysilicon gate electrode 112 and a pair of shallow-depth, source and drain extension regions 130, 132 are formed in substrate 102 by an ion implantation 128 ("extension implant") process, utilizing the polysilicon gate electrode 112 as an implantation mask. Source and drain extension regions 130, 132 thus are formed in a self-aligned manner and extend within the substrate 102 to immediately adjacent the edges of sidewalls 114, 116 of the gate electrode/gate oxide layer stack 112/104. The implanted ions may comprise an n-type dopant, e.g., As ions, if an NMOS is desired to be formed, or a p-type dopant, e.g., B-containing ions, if a PMOS is to be formed. By way of illustration only, n-type source and drain extension regions 130, 132 having a shallow-depth of from about 100 to about 200 Å and a doping of from about $1 \times 10^{20}$ to about $1 \times 10^{21}$ da/cm$^3$ may be formed in crystalline Si by implanting As ions at a dosage of from about $1 \times 10^{15}$ to about $2 \times 10^{15}$ da/cm$^2$ and energies of from about 2 to about 5 KeV.

Figure 1F:
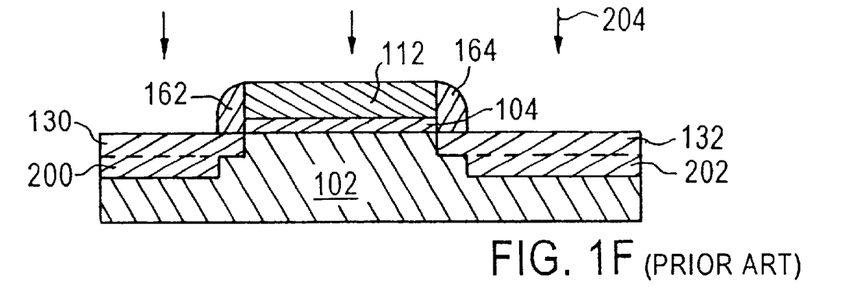

Referring now to FIG. 1(F), tapered width sidewall spacers 162, 164 comprised of an insulative material, typically a silicon oxide, nitride, or oxynitride, are then formed on the surfaces of sidewalls 114, 116 of the gate electrode/gate oxide layer stack 112/104. Typically, the tapered width sidewall spacers 162, 164 are formed by a process comprising forming, as by a suitable conventional deposition method, a blanket layer of the insulative material covering all exposed surface portions of the substrate 102 as well as all exposed surfaces of the various features formed therein or thereon, including, inter alia, the opposing sidewall surfaces 114, 116 and top surface of the polysilicon gate electrode 112. The thickness of the blanket insulative layer is selected so as to provide tapered sidewall spacers 162, 164 having a desired width profile. The blanket insulative layer is then subjected to an anisotropic etching process, e.g., plasma etching in a fluorine-containing plasma, for selectively removing the laterally extending portions thereof and forming the tapered width sidewall spacers 162, 164. Following the formation of the tapered sidewall spacers 162, 164, a pair of deeper source and drain regions 200, 202 are formed, as by a "main implant" ion implantation process utilizing the tapered sidewall spacers 162, 164 as implantation masks, generally within the portions of substrate 102 where the shallow-depth source and drain extension regions 130, 132 were previously formed. As shown in the figure, the deeper source and drain regions 200, 202 formed by the "main implant" process extend beyond the depth of source and drain extension regions 130, 132, except at the portions of the latter regions underlying the sidewall spacers 162, 164. By way of illustration only, according to conventional practice, typical As implantation conditions for forming source and drain regions 200, 202 of a Si wafer-based NMOS transistor having a peak As n-type dopant concentration of from about $1 \times 10^{20}$ to about $1 \times 10^{21}$ da/cm$^3$ at a depth of from about 200 to about 400 Å below the surface of the Si wafer include dosages of from about $3 \times 10^{15}$ to about $6 \times 10^{15}$ da/cm$^2$ and energies of from about 10 to about 40 KeV.

Figure 1G:
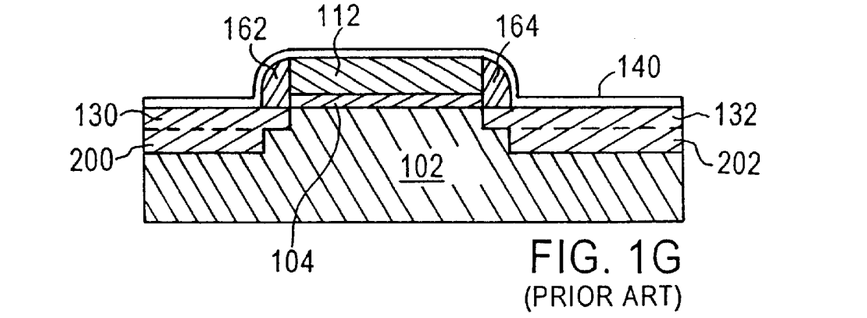

With reference to FIG. 1(G), in a following step, a blanket layer 140 of a metal, typically Pt, Co, Ni, or Ti, is formed, as by a PVD process such as DC sputtering, to cover all exposed surfaces of the thus-formed structure. The thickness of the metal deposited in this step depends upon several factors, including, inter alia, the particular selected metal, its Si consumption ratio, and desired thickness (hence resistivity) of the resultant metal silicide.

Figure 1H:
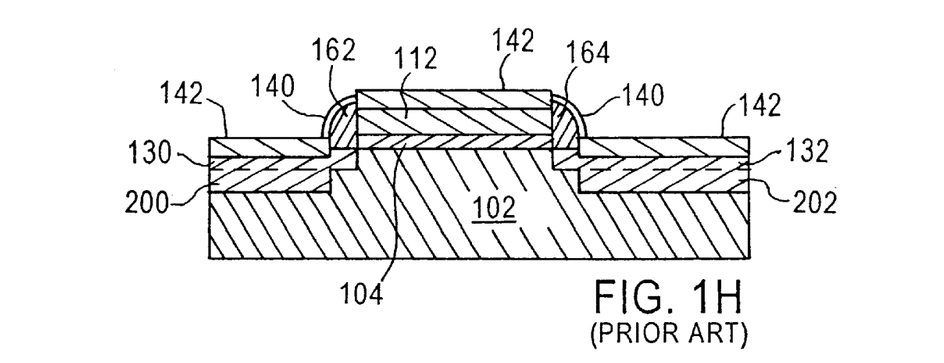
Figure 1I:
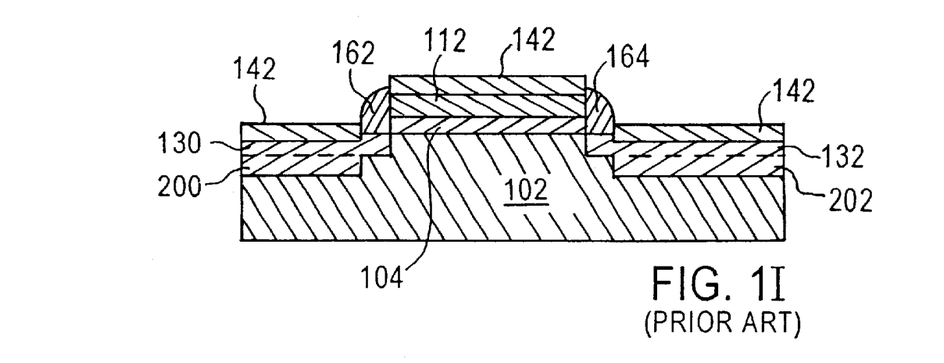

Adverting to FIG. 1(H), following metal layer 140 deposition, a thermal treatment, typically RTA, is performed at a temperature and for an interval sufficient to convert at least a portion of the thickness of metal layer 140 to the corresponding electrically conductive metal silicide 142, e.g., PtSi$_2$, CoSi$_2$, NiSi, or TiSi$_2$. Since the metal silicide 142 forms only where the metal layer 140 is in contact with underlying Si of Si substrate 102, the unreacted portions of the metal layer 140 formed over the sidewall spacers 162, 164 and oxide-filled isolation trenches 216 (not shown in the figure for simplicity) are selectively removed, as by a wet chemical etch process, to yield the structure shown in FIG. 1(I), which structure can then undergo further processing for contact formation to the source/drain regions and gate electrode.

When Ni is utilized as metal layer 140, conversion of Ni to NiSi may be accomplished by means of a one-step thermal process, typically RTA performed at temperatures of from about 350 to about 750° C., for example, in a nitrogen ($N_2$)-containing inert atmosphere at 550° C. for about 40 sec. The formation of NiSi commences at about 250° C., when the Ni layer 140 reacts with the Si substrate 102 to form Ni$_2$Si. With increase in reaction time or temperature to above about 300° C., the Ni$_2$Si undergoes further reaction with the Si substrate 102 to form NiSi layer 142. By way of illustration only, a Ni layer 140 from about 100 to about 200 Å thick may be subjected to silicidation reaction with the Si substrate 102 (as described above) to form a NiSi layer 142 extending to a depth below the Si substrate 102 of from about 180 to about 360 Å. Removal of any unreacted portions of Ni layer 140 can be accomplished, for example, by etching with a 2:1 $H_2SO_4/H_2O_2$ mixture at a temperature of about 100° C. An aqueous mixture of $NH_4OH$ and $H_2O_2$ may be utilized for stripping other unreacted metals, i.e., Co, Ti, Pt.

Figure 2:
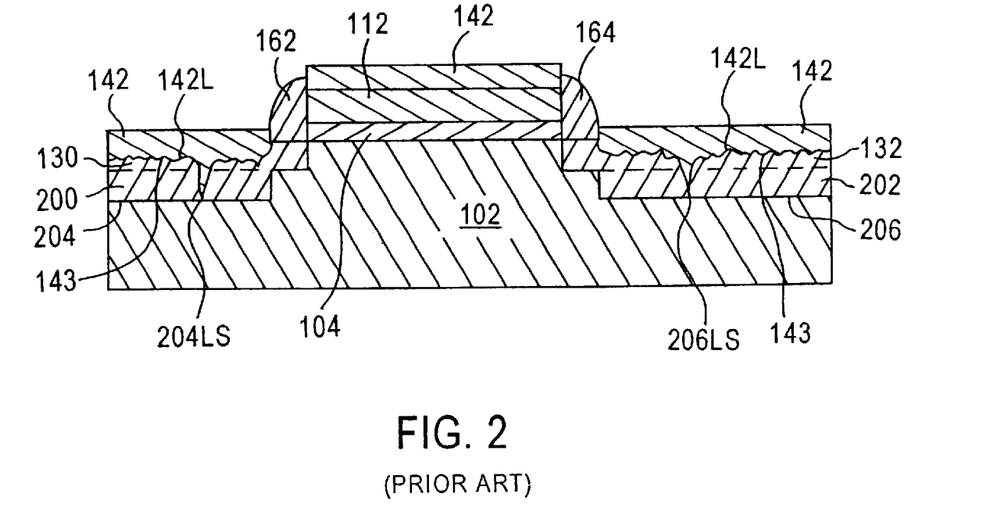
FIG. 2 is a schematic, simplified, cross-sectional view illustrating the effect of metal silicide/Si substrate interface roughness on local local punch-through of source/drain junctions.

Referring now to FIG. 2, a problem frequently encountered with salicide processing sequences, such as the one described supra, is the formation of metal silicide layers 142 wherein the lower surfaces 142L thereof are rough at the metal silicide/Si interfaces 143, which roughness can disadvantageously result in local penetration of the underlying silicon substrate 102 by the metal silicide layer 142. In particular, such local penetration, or "spiking" of the Si substrate 102 in the regions below the source and drain regions 200, 202 can cause local electrical punch-through of the source and drain junctions 204, 206, for example, as respectively indicated by 204LS, 206LS in the figure, thereby resulting in junction leakage. While the effect of local electrical punch-through or spiking is significant when a metal having a high Si consumption ratio is utilized, e.g., Co, silicide/Si interface roughness resulting in local electrical punch-through can also result from incompatibility between a particular metal and a particular dopant species utilized for forming the source and drain regions. In this regard, a notable (but not exclusive) example is the incompatibility of Ni as the metal and As atoms/ions as the n-type dopant species for Si, e.g., in the formation of Si-based NMOS transistors and CMOS devices.

Specifically, the presence of significant amounts of As in NiSi layers on source/drain regions of NMOS transistors and CMOS devices results in a substantial amount or degree of roughness at the NiSi/Si interface, leading to increased junction leakage due to local electrical punch-through or "spiking" of the source/drain junctions, as described above. Further, since As atoms or ions tend to be rejected (i.e., expelled) from NiSi films, they can accumulate in the vicinity of the NiSi/Si interface and below, thereby exacerbating the problem of local electrical punch-through and disadvantageously altering the dopant concentration vs. depth profile so as to degrade transistor properties. Such incompatibility with NiSi is peculiar to As (i.e., it is not observed with other commonly utilized n-type dopant species) and is particularly troublesome in that (1) As is otherwise advantageous vis-à-vis the other common n-type dopant species (i.e., phosphorus (P) and antimony (Sb)) utilized in forming ion implanted, shallow junction source and drain regions in high-speed, Si-based NMOS transistors and CMOS devices, in view of its low diffusivity and high solid solubility, relative to P and Sb; and (2) NiSi is a preferred electrically conductive, metal silicide material vis-à-vis other metal silicides ($CoSi_2$, $TiSi_2$, $PtSi_2$, etc.) in view of its rapid formation at relatively low temperatures (350–600° C.) in a one-step RTA process, lack of linewidth dependence, low resistivity, low Si consumption ratio, and increased process flexibility.

Accordingly, there exists a clear need for improved methodology for simple, reliable, and rapid formation of metal silicide layers for use in the manufacture of semiconductor IC devices, e.g., in the formation of electrically conductive contact layers to dopant-containing source and drain regions in MOS transistors and/or CMOS devices, which methodology avoids the drawbacks associated with the conventional salicide techniques and methodologies and provides, inter alia, high-quality MOS transistors and/or CMOS devices exhibiting reduced junction leakage and improved transistor characteristics and properties.

The present invention, wherein two different dopant species of same conductivity type are introduced, e.g., by ion implantation processing, into a Si-based semiconductor substrate for forming a doped region of selected conductivity type therein, such that the depth and magnitude of the peak of the concentration vs. depth profile of each dopant species are different, wherein the maximum concentration level of the more compatible, first dopant species is above the depth to which the metal silicide layer is formed and the maximum concentration level of the less compatible, second dopant species (i.e., more likely to cause roughness of metal silicide/Si interface) is less than that of the first dopant species and is located below the depth to which the metal silicide layer is formed, eliminates, or at least substantially reduces, the disadvantageous interaction(s) between the metal silicide and the second dopant species leading to roughness of the metal silicide/silicon interface and local electrical punch-through of the source/drain junctions. The inventive methodology thus effectively addresses and solves the need for improved methodology for the manufacture of high-quality MOS transistors and/or CMOS devices with reduced junction leakage due to local electrical punch-through of the source and drain junctions arising from the rough interface. Further, the methodology provided by the present invention enjoys diverse utility in the manufacture of numerous and various types of semiconductor devices and/or components employing salicide technology.

DISCLOSURE OF THE INVENTION

An advantage of the present invention is an improved method for forming an electrically conductive metal silicide layer on a Si-based semiconductor substrate.

Another advantage of the present invention is an improved method for forming an electrically conductive NiSi layer on an As-doped, n-type region of a Si semiconductor substrate.

Yet another advantage of the present invention is an improved method of manufacturing a Si-based NMOS transistor or CMOS device including electrically conductive NiSi layers formed in contact with As-doped, n-type source and drain regions.

Still another advantage of the present invention is improved Si-based semiconductor devices comprising at least one electrically conductive NiSi layer formed in contact with an As, n-type Si region.

Additional advantages and other features of the present invention will be set forth in the description which follows and in part will become apparent to those having ordinary skill in the art upon examination of the following or may be learned from the practice of the present invention. The advantages of the present invention may be realized as particularly pointed out in the appended claims.

According to an aspect of the present invention, the foregoing and other advantages are obtained in part by a method of manufacturing a semiconductor device, which method comprises the steps of:

(a) providing a silicon (Si)-based semiconductor substrate having a surface;

(b) introducing a first dopant of a first conductivity type into at least one selected portion of the substrate, such that the concentration vs. depth profile of the first dopant exhibits a first peak dopant concentration at a first depth below the substrate surface;

(c) introducing a second dopant of the first conductivity type into the at least one selected portion of the substrate, such that the concentration vs. depth profile of the second dopant exhibits a second peak dopant concentration at a second depth below the substrate surface, the second depth being greater than the first depth and the second peak dopant concentration being less than the first peak dopant concentration;

(d) forming a metal layer on the substrate surface overlying the at least one selected portion of the substrate;

(e) reacting the metal layer with the at least one selected portion of the Si-based substrate to form a layer of an electrically conductive metal silicide extending below the substrate surface to a third depth which is greater than the first depth but less than the second depth, thereby eliminating or at least substantially reducing roughness of the interface between the metal suicide layer and the at least one selected portion of the Si substrate by minimizing the concentration of the second dopant in the metal silicide layer.

According to embodiments of the present invention, steps (b) and (c) each comprise implanting ions of the respective first or second dopant.

According to particular embodiments of the present invention, step (b) comprises implanting phosphorus (P)-containing or antimony (Sb)-containing ions as the n-type first dopant; and step (c) comprises implanting an n-type second dopant comprising arsenic (As) ions as the n-type second dopant.

According to further embodiments of the present invention, step (c) comprises implanting the ions of the second dopant at a higher energy but lower dosage than utilized in step (b) for implanting the ions of the first dopant; and the method further includes either performing step (b) followed by step (c) or performing step (c) followed by step (b).

According to still further embodiments of the present invention, step (d) comprises forming a metal layer comprising at least one metal selected from the group consisting of: nickel (Ni), cobalt (Co), titanium (Ti), and platinum (Pt).

According to particular embodiments of the present invention, step (d) comprises forming a Ni layer; and step (e) comprises forming an electrically conductive NiSi layer.

According to yet further embodiments of the present invention, steps (b) and (c) each comprise implanting n-type dopant ions for forming n-type source and drain regions in selected portions of the substrate as part of a process for forming an NMOS transistor or CMOS device (e.g., implanting P-containing or Sb-containing ions in step (b) and implanting As ions in step (c)); step (d) comprises forming a Ni layer overlying at least the selected portions of the substrate; and step (e) comprises reacting the Ni layer with the Si-based substrate to form a layer of electrically conductive nickel silicide (NiSi).

According to particular embodiments of the present invention, step (a) comprises providing a monocrystalline Si wafer substrate; step (b) comprises implanting P-containing or Sb-containing first dopant ions at a dosage and energy such that the first depth is from about 50 to about 150 Å below the substrate surface and the first peak dopant concentration is from about $1 \times 10^{20}$ to about $1 \times 10^{21}$ da/cm$^3$; step (c) comprises implanting As second dopant ions at a dosage and energy such that the second depth is from about 250 to about 450 Å below the substrate surface and the second peak dopant concentration is from about $5 \times 10^{19}$ to about $2 \times 10^{20}$ da/cm$^3$; step (d) comprises forming a Ni layer having a thickness of from about 100 to about 200 Å; and step (e) comprises reacting the Ni layer with the Si substrate by heating in an inert atmosphere at a temperature of from about 300 to about 550° C. for from about 30 to about 60 sec. to form an electrically conductive NiSi layer extending to the third depth below the substrate surface of from about 180 to about 360 Å; wherein: step (b) comprises implanting P-containing or Sb-containing first dopant ions at a dosage of from about $3 \times 10^{15}$ to about $6 \times 10^{15}$ da/cm$^2$ and energy from about 5 to about 10 KeV for P-containing ions and from about 10 to about 25 KeV for Sb-containing ions; and step (c) comprises implanting As second dopant ions at a dosage of from about $1 \times 10^{15}$ to about $2 \times 10^{15}$ da/cm$^2$ and energy of from about 35 to about 85 KeV.

According to another aspect of the present invention, a method of manufacturing an NMOS transistor or CMOS semiconductor device comprises the steps of:

(a) providing a Si semiconductor substrate having a surface;

(b) forming a thin gate insulator layer in contact with the substrate surface;

(c) forming an electrically conductive gate electrode on a portion of the thin gate insulator layer, the gate electrode comprising first and second opposing side surfaces and a top surface;

(d) forming a pair of shallow-depth, n-type source and drain extension regions in selected portions of the substrate, each of the source and drain extension regions extending laterally to beneath an edge of a respective one of the first and second opposing side surfaces of the gate electrode;

(e) forming sidewall spacers composed of an insulating material on each of the first and second opposing side surfaces of the gate electrode;

(f) implanting the selected substrate portions with P-containing or Sb-containing n-type dopant ions, utilizing the sidewall spacers as an implantation mask, to form a pair of deeper n-type source and drain regions than formed in step (d), such that the concentration vs. depth profile of the implanted P-containing or Sb-containing n-type dopant ions exhibits a first peak dopant concentration at a first depth below the substrate surface;

(g) implanting the selected substrate portions with As n-type dopant ions, utilizing the sidewall spacers as an implantation mask, to form a pair of deeper n-type source and drain regions than formed in step (f), such that the concentration vs. depth profile of the implanted As n-type dopant ions exhibits a peak dopant concentration at a second depth below the substrate surface, the second depth being greater than the first depth and the second peak dopant concentration being less than the first peak dopant concentration;

(h) forming a layer of Ni on the substrate surface overlying at least the pair of n-type source and drain regions; and (i) reacting the Ni layer to form an electrically conductive NiSi layer extending into the pair of n-type source and drain regions for a third depth below the substrate surface, the third depth being greater than the first depth but less than the second depth, thereby eliminating or at least substantially reducing roughness of the interfaces between the NiSi layers and the n-doped source and drain regions by minimizing the concentration of the As n-type dopant ions in the NiSi layers.

According to embodiments of the present invention, the method comprises either performing step (f) followed by step (g), or performing step (g) followed by step (f).

According to particular embodiments of the present invention, step (d) comprises forming the pair of n-type source and drain extension regions at a shallow depth of from about 100 to about 200 Å; step (f) comprises implanting the P-containing or Sb-containing n-type dopant ions at a dosage and energy such that the first depth is from about 50 to about 150 Å below the substrate surface and the first peak dopant concentration is from about $1 \times 10^{20}$ to about $1 \times 10^{21}$ da/cm$^3$; step (g) comprises implanting the As n-type dopant ions at a dosage and energy such that the second depth is from about 250 to about 450 Å below the substrate surface and the second peak dopant concentration is from about $5 \times 10^{19}$ to about $2 \times 10^{20}$ da/cm$^3$; step (h) comprises forming a Ni layer having a thickness of from about 100 to about 200 Å; and step (i) comprises reacting the Ni layer with the Si substrate to form a NiSi layer extending to the third depth below the substrate surface of from about 180 to about 360 Å, wherein: step (d) comprises implanting As n-type dopant ions at a dosage of from about $1 \times 10^{15}$ to about $2 \times 10^{15}$ da/cm$^2$ and energy of from about 2 to about 5 KeV; step (f) comprises implanting the P-containing or Sb-containing ions at a dosage of from about $3 \times 10^{15}$ to about $6 \times 10^{15}$ da/cm$^2$ and energy from about 5 to about 10

KeV for P-containing ions and from about 10 to about 25 KeV for Sb-containing ions; step (g) comprises implanting the As ions at a dosage of from about $1\times10^{15}$ to about $2\times10^{15}$ da/cm and energy of from about 35 to about 85 KeV; and step (i) comprises heating the Ni layer in an inert atmosphere at a temperature of from about 300 to about 550° C. for from about 30 to about 60 sec.

According to yet another aspect of the present invention, a semiconductor device comprises:
- (a) a Si semiconductor substrate having a surface;
- (b) at least one n-type doped region formed in the substrate, the n-type doped region comprising:
  - (i) implanted P-containing or Sb-containing n-type dopant ions, the concentration vs. depth profile of the implanted P-containing or Sb-containing dopant ions exhibiting a first peak dopant concentration at a first depth below the substrate surface; and
  - (ii) implanted As n-type dopant ions, the concentration vs. depth profile of the As dopant ions exhibiting a second peak dopant concentration at a second depth below the substrate surface, the second depth being greater than the first depth and the second peak dopant concentration being less than the first peak dopant concentration; and
- (c) an electrically conductive NiSi layer extending from the substrate surface into the at least one n-type doped region to a third depth below the substrate surface, the third depth being greater than the first depth but less than the second depth, wherein the third depth being less than the second depth eliminates or at least substantially reduces roughness at the interface between the NiSi layer and the n-type doped region by minimizing the concentration of As n-type dopant ions in the NiSi layer.

According to embodiments of the present invention, the at least one n-type As-doped region is a source or drain region of an NMOS transistor or a CMOS device.

Additional advantages and aspects of the present invention will become readily apparent to those skilled in the art from the following detailed description, wherein only the preferred embodiment of the present invention is shown and described, simply by way of illustration of the best mode contemplated for carrying out the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWING

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

The present invention addresses and solves problems arising from manufacturing submicron-dimensioned, shallow-junction MOS transistors and CMOS devices suitable for use in high-density integration semiconductor devices, wherein, as part of the fabrication methodology, electrically conductive metal silicide layers are formed in contact with doped semiconductor regions, e.g., source and drain regions. More specifically, the present invention advantageously provides an improvement in salicide technology by affording a significant and substantial reduction in the amount and severity of roughness of the metal silicide/Si interface exhibited with particular combinations of metals and dopant species, such as Ni and As, respectively. The inventive methodology thus provides significantly reduced local electrical punch-through or "spiking" of the source and drain junctions, typically manifested as increased junction leakage current. Moreover, the present invention provides increased device reliability while decreasing product yield problems associated with the conventional salicide technology. In addition, the inventive methodology is fully compatible with all other aspects of existing processing methodology.

The present invention is based upon the discovery that formation of high quality interfaces between electrically conductive metal silicides and dopant-containing, Si-based semiconductor layers or substrates, illustratively, but not limited to, NiSi/As-doped n-type Si interfaces, for use in MOS transistors and CMOS devices, can be readily formed by a process which generally follows conventional salicide processing, e.g., as illustrated in FIGS. 1(A)–1(I), but is modified in key respect to eliminate, or at least substantially reduce, disadvantageous roughness of the NiSi/Si interface leading to source/drain junction "spiking" manifesting in increased junction leakage current, by reducing the concentration of an interface roughness-causing dopant in the Si layer or substrate in the region or stratum thereof where the silicidation reaction occurs, to a level not exceeding a predetermined maximum level, below which roughness of the metal silicide/Si interface does not result. A key feature of the present invention is the introduction of two different dopant species of same conductivity type into the Si substrate, e.g., by ion implantation, wherein one of the dopant species, when present in significant concentration in the subsequently formed metal silicide layer, causes roughness of the metal silicide/Si interface. According to the invention, ion implantation of the first and second dopant species is performed under selected processing conditions such that the depth and magnitude of the peak of the concentration vs. depth profile of each dopant species are different. More specifically, the maximum concentration of the first, more compatible dopant species is controlled during implantation to be at a depth within the Si layer or substrate above the depth to which the metal silicide layer is subsequently formed, and the maximum concentration level of the second, less compatible dopant species (i.e., more likely to cause roughness of the metal silicide/Si interface) is less than that of the first, more compatible dopant species and is located below the depth to which the metal silicide layer is formed. As a consequence of the inventive methodology, the concentration of the second, less compatible dopant, in the metal suicide layer is significantly reduced from that which is obtained according to conventional practice, i.e., to a level below that necessary for metal silicide/Si interface roughness to occur. As a further consequence of the inventive methodology, local electrical punch-through or "spiking", e.g., of source/drain junctions in MOS transistors and CMOS devices, is eliminated or at least substantially reduced, and reduced leakage current junctions are obtained. Moreover, according to the inventive methodology, high quality, Si-based, shallow-junction MOS transistors and CMOS devices can be reliably and conveniently fabricated in a cost-effective manner utilizing conventional manufacturing techniques and apparatus.

Figure 3A:
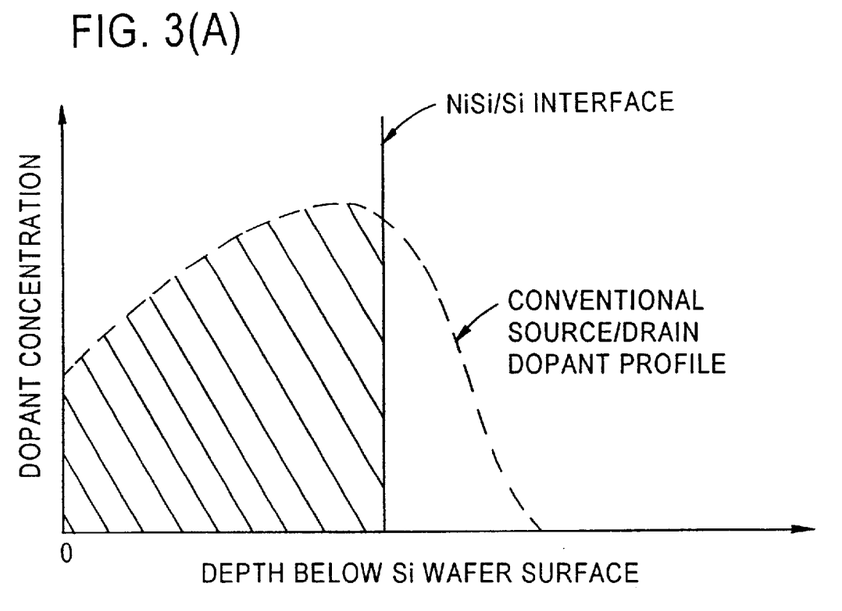
FIGS. 3(A)–3(B) are graphs illustrating dopant concentration vs. depth profiles for the main source/drain implantations performed according to the conventional and inventive methodologies, respectively.

Referring now to FIG. 3(A), which illustrates an example where a NiSi metal silicide layer is formed to a depth within an As-doped n-type region of a Si substrate, shown therein is the dopant concentration vs. depth profile of As n-type dopant ions introduced into a monocrystalline Si wafer substrate in a conventional "main" implantation step for forming source and drain junctions as part of a process for forming NMOS transistors and CMOS devices, i.e., corresponding to the situation obtained upon completion of the process stage illustrated in FIG. 1(F). According to the conventional methodology for implantation of As n-type dopant ions into monocrystalline Si wafer substrates for conducting the "main" implantation step of FIG. 1(F), As implant dosages of from about $4 \times 10^{15}$ to about $6 \times 10^{15}$ da/cm$^2$ and ion energies of from about 30 to about 40 KeV yield an As concentration vs. depth profile as shown in the figure which exhibits a significant As concentration at the Si surface and a peak As concentration of about $5 \times 10^{20}$ da/cm$^3$ at a depth of from about 200 to about 300 Å below the Si surface. In addition, the peak As concentration is at a depth within the Si substrate which is near the depth below the Si surface to which silicidation reaction to form the NiSi layer conventionally occurs (i.e., depth of from about 180 to about 360 Å; Ni precursor layer thickness of from about 100 to about 200 Å; and RTA at about 300–550° C. for about 30–60 sec. in a N$_2$ atmosphere).

The total amount, thus concentration, of As n-type dopant species initially contained in the region or stratum of the Si substrate which is later subjected to silicidation reaction to form NiSi is indicated in the figure by the single-hatched lines. As is apparent from the figure, a significant total amount or concentration of As dopant is at least initially present in the silicidation region or stratum of the substrate (i.e., extending from the Si surface down to the indicated NiSi depth), and thus is available for inclusion in the NiSi layer. Because of the tendency for As ions/atoms to be rejected (i.e., expelled) from NiSi and thus reduce their concentration in the NiSi by transiting across the NiSi/Si interface to the underlying Si, if the initial concentration of As ions/atoms in the NiSi layer exceeds a threshold level, the amount of As ions/atoms transiting the NiSi/Si interface may be sufficient to cause significant roughness at the NiSi/Si interface, as for example, shown in FIG. 2, leading to local electrical punch-through of the source and drain junctions by the NiSi layers. The latter phenomenon is manifested in increased source/drain junction current leakage and diminished transistor characteristics.

While the exact mechanism for the increased roughness of the NiSi/n-Si interfaces which occurs with As-doped n-type Si is not known with certainty, and not wishing to be bound by any particular theory, it is nonetheless believed that the above-mentioned tendency for significant amounts of As ions/atoms to be rejected (i.e., expelled) from the NiSi film or layer into the underlying Si is responsible for the observed interfacial roughness in view of the requirement for the relatively large As ions/atoms to transit, and thus damage, the NiSi/n-Si interface upon rejection (i.e., expulsion) from the NiSi layer.

Figure 3B:
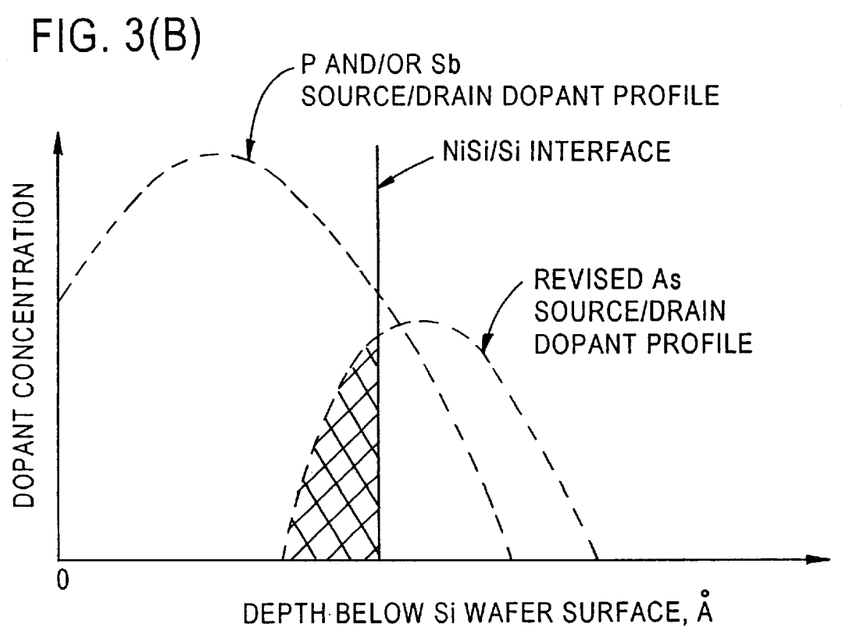

Referring now to FIG. 3(B), according to the invention, the conditions for performing the "main" implantation step of FIG. 1(F) are altered from those conventionally employed, so as to implant the Si wafer substrate with two species of n-type dopant ions having different tendencies for causing roughness, etc., of the interface between the selected metal and the Si substrate. Specifically, the depth and magnitude of the peak of the concentration vs. depth profile of each of the two implanted dopant species are selected to be different, such that the maximum concentration level of the more compatible (i.e., lesser or no tendency to cause roughness of the metal silicide/Si interface), first dopant species is above the depth in the Si substrate to which the metal silicide layer is formed, and the maximum concentration of the less compatible (i.e., significant tendency to cause roughness of the metal silicide/Si interface), second dopant species is less than that of the first dopant species and is located below the depth in the Si substrate to which the metal silicide layer is formed.

With continued reference to FIG. 3(B), by way of illustration of an exemplary embodiment of the present invention, the above-described salicide-type process including a "main" implantation step as shown in FIG. 1(F) for forming n-type source and drain regions 200, 202 is modified such that P-containing or Sb-containing (or a combination thereof) first n-type dopant ions are implanted in an upper portion of each of the source and drain regions 200, 202 as a main dopant such that the peak of the concentration vs. depth profile of the implanted P and/or Sb-containing ions is above the depth within the Si substrate to which the NiSi layer 142 is subsequently formed; and As second n-type dopant ions are implanted as an auxiliary implant in a lower portion of each of the source and drain regions 200, 202 such that the peak of the concentration vs. depth profile of the implanted As ions is of a lower magnitude than that of the implanted P and/or Sb-containing dopant ions and is below the depth within the substrate to which the NiSi layer 142 is subsequently formed. In general, such an As concentration vs. depth profile may be readily achieved by increasing the energy of the implanted As dopant ions while decreasing their dosage, relative to the energies and dosages utilized according to conventional As-implantation processing resulting in the As dopant concentration vs. depth profile of FIG. 3(A). The sequence of implantation of the first and second dopant species is not critical; hence the first dopant species may be implanted either prior or subsequent to implantation of the second dopant species. Also, in addition to doping the upper portions of the source and drain regions 200, 202, the main implant, e.g., of P and/or Sb-containing ions, serves to provide a sufficient amount of doping of the polysilicon gate 112 to prevent deleterious formation of depletion regions above the gate oxide layer 104.

As a consequence of the inventive methodology, and in view of the low amounts of dopant ions/atoms contained in the shallow depth source and drain extension regions 130, 132 (even in the case where As dopant ions are utilized in forming the latter), the concentration of As second n-type dopant ions present in the upper portion of each of the source and drain regions 200, 202 extending to the depth below the Si surface to which silicidation reaction occurs to form the NiSi layer 142 is very low. By way of illustration only, suitable first and second dopant species implantation conditions for use with a conventional NiSi layer depth in monocrystalline Si of from about 180 to about 360 Å are as follows: for P-containing and/or Sb-containing first n-type dopant ions- dosage of from about $3 \times 10^{15}$ to about $6 \times 10^{15}$ da/cm$^2$ and energy from about 5 to about 10 KeV for P-containing first dopant ions and from about 10 to about 25 KeV for Sb-containing first dopant ions to yield a concentration vs. depth profile with a peak or maximum P and/or Sb concentration of from about $1\times10^{20}$ to about $1\times10^{21}$ da/cm$^3$ at a depth below the Si surface of from about 50 to about 150 Å; for As second n-type dopant ions- dosage of from about $1\times10^{15}$ to about $2\times10^{15}$ da/cm$^2$ and energy of from about 35 to about 85 KeV to yield a concentration vs. depth profile with a peak or maximum As concentration of from about $5\times10^{19}$ to about $2\times10^{20}$ da/cm$^3$ at a depth below the Si surface of from about 250 to 450 Å.

The total amount, thus concentration, of As dopant initially contained in the region or stratum of the Si substrate subsequently subjected to silicidation reaction with the overlying Ni layer to form NiSi is indicated in FIG. 3(B) by the double-hatched lines. As is apparent from the figure, the total amount or concentration of As dopant initially present in the silicidation region or stratum (extending from the Si surface down to the indicated NiSi depth), and thus at least initially available for inclusion in the NiSi layer, is significantly lower than that which obtains according to the conventional practice shown in FIG. 3(A). As a consequence, according to the present invention, the concentration of As dopant present in the silicidation region or stratum is below the threshold value necessary for rough-textured NiSi/Si interfaces to occur in that the amount of rejected (i.e., expelled) As atoms/ions transiting the NiSi/Si interface is too low to disrupt the interface and lead to roughness thereof. Therefore, according to the present invention, local electrical punchtrough or "spiking" of the source and drain/substrate junctions by metal silicide layers, formed as part of salicide processing, is eliminated, or at least substantially reduced, resulting in high-quality, shallow source/drain junctions with decreased leakage currents.

As a consequence of the inventive methodology, deleterious formation of rough metal silicide/Si interfaces is avoided, or at least substantially minimized, so as to yield high-quality, low leakage current, shallow-depth source and drain junctions suitable for use in the fabrication of submicron-dimensioned MOS transistors and CMOS devices with improved operating characteristics. The inventive methodology is not limited to use with the illustrated combination of Ni as the metal and As dopants, but rather is applicable to all manner of combinations of metals and dopant species wherein mutual incompatibility of particular dopants and metals results in disadvantageous degradation of interface quality, smoothness, and resultant junction and device properties. Thus, given the present disclosure and objectives of the invention, selection of dopant-metal combinations and implantation conditions, etc., suitable for use in a particular application can be readily determined by one of ordinary skill. Moreover, the invention can be practiced by use of conventional methodologies and instrumentalities at rates consistent with the throughput requirements of automated manufacturing processes and is fully compatible with conventional process flow for the manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, which method comprises the steps of:
   (a) providing a silicon (Si)-based semiconductor substrate having a surface;
   (b) introducing a first dopant of a first conductivity type into at least one selected portion of said substrate, such that the concentration vs. depth profile of said first dopant exhibits a first peak dopant concentration at a first depth below said substrate surface;
   (c) introducing a second dopant of said first conductivity type into said at least one selected portion of said substrate, such that the concentration vs. depth profile of said second dopant exhibits a second peak dopant concentration at a second depth below said substrate surface, said second depth being greater than said first depth and said second peak dopant concentration being less than said first peak dopant concentration;
   (d) forming a metal layer on said substrate surface overlying said at least one selected portion of said substrate;
   (e) reacting said metal layer with said at least one selected portion of said Si-based substrate to form a layer of an electrically conductive metal silicide extending below said substrate surface to a third depth which is greater than said first depth but less than said second depth, thereby eliminating or at least substantially reducing roughness of the interface between said metal silicide layer and said at least one selected portion of said Si-based substrate by minimizing the concentration of said second dopant in said metal silicide layer.

2. The method as in claim 1, wherein:
steps (b) and (c) each comprise implanting ions of the respective first and second dopants.

3. The method as in claim 2, wherein:
step (b) comprises implanting an n-type first dopant comprising phosphorus (P)-containing ions or antimony (Sb)-containing ions.

4. The method as in claim 2, wherein:
step (c) comprises implanting an n-type second dopant comprising arsenic (As) ions.

5. The method as in claim 2, wherein:
step (c) comprises implanting said ions of said second dopant at a higher energy but lower dosage than utilized in step (b) for implanting said ions of said first dopant.

6. The method as in claim 5, comprising:
performing step (b) followed by step (c).

7. The method as in claim 5, comprising:
performing step (c) followed by step (b).

8. The method as in claim 1, wherein:
step (d) comprises forming a metal layer comprising at least one metal selected from the group consisting of: nickel (Ni), cobalt (Co), titanium (Ti), and platinum (Pt).

9. The method as in claim 8, wherein:
step (d) comprises forming a Ni layer; and
step (e) comprises forming an electrically conductive NiSi layer.

10. The method as in claim 1, wherein:
steps (b) and (c) each comprise implanting n-type dopant ions for forming n-type source and drain regions in selected portions of said substrate as part of a process for forming an NMOS transistor or CMOS device;

step (d) comprises forming a Ni layer so as to overlie at least said selected portions of said substrate; and step (e) comprises reacting said Ni layer with said Si-based substrate to form a layer of electrically conductive nickel silicide (NiSi).

11. The method as in claim 10, wherein:

step (b) comprises implanting P-containing or Sb-containing n-type dopant ions; and step (c) comprises implanting As n-type dopant ions.

12. The method as in claim 11, wherein:

step (a) comprises providing a monocrystalline Si wafer substrate;

step (b) comprises implanting P-containing or Sb-containing first dopant ions at a dosage and energy such that said first depth is from about 50 to about 150 Å below said substrate surface and said first peak dopant concentration is from about $1 \times 10^{20}$ to about $1 \times 10^{21}$ da/cm$^3$;

step (c) comprises implanting As second dopant ions at a dosage and energy such that said second depth is from about 250 to about 450 Å below said substrate surface and said second peak dopant concentration is from about $5 \times 10^{19}$ to about $2 \times 10^{20}$ da/cm$^3$;

step (d) comprises forming a Ni layer having a thickness of from about 100 to about 200 Å; and step (e) comprises reacting said Ni layer with said Si substrate by heating in an inert atmosphere at a temperature of from about 300 to about 550° C. for from about 30 to about 60 sec. to form an electrically conductive NiSi layer extending to said third depth below said substrate surface of from about 180 to about 360 Å.

13. The method as in claim 12, wherein:

step (b) comprises implanting said P-containing or Sb-containing first dopant ions at a dosage of from about $3 \times 10^{15}$ to about $6 \times 10^{15}$ da/cm$^2$ and energy from about 5 to about 10 KeV for P-containing ions and from about 10 to about 25 KeV for Sb-containing ions; and step (c) comprises implanting said As second dopant ions at a dosage of from about $1 \times 10^{15}$ to about $2 \times 10^{15}$ da/cm$^2$ and energy of from about 35 to about 85 KeV.

14. A method of manufacturing an NMOS transistor or CMOS semiconductor device, which method comprises the steps of:

(a) providing a Si semiconductor substrate having a surface;

(b) forming a thin gate insulator layer in contact with said substrate surface;

(c) forming an electrically conductive gate electrode on a portion of said thin gate insulator layer, said gate electrode comprising first and second opposing side surfaces and a top surface;

(d) forming a pair of shallow-depth, n-type source and drain extension regions in selected portions of said substrate, each of said source and drain extension regions extending laterally to beneath an edge of a respective one of said first and second opposing side surfaces of said gate electrode;

(e) forming sidewall spacers composed of an insulating material on each of said first and second opposing side surfaces of said gate electrode;

(f) implanting said selected substrate portions with P-containing or Sb-containing n-type dopant ions, utilizing said sidewall spacers as an implantation mask, to form a pair of deeper n-type source and drain regions than formed in step (d), such that the concentration vs. depth profile of the implanted P-containing or Sb-containing n-type dopant ions exhibits a first peak dopant concentration at a first depth below said substrate surface;

(g) implanting said selected substrate portions with As n-type dopant ions, utilizing said sidewall spacers as an implantation mask, to form a pair of deeper n-type source and drain regions than formed in step (f), such that the concentration vs. depth profile of the implanted As n-type dopant ions exhibits a second peak dopant concentration at a second depth below said substrate surface, said second depth being greater than said first depth and said second peak dopant concentration being less than said first peak dopant concentration;

(h) forming a layer of Ni on said substrate surface overlying at least said pair of n-type source and drain regions; and (i) reacting said Ni layer to form a pair of electrically conductive NiSi layers extending into said pair of n-type source and drain regions for a third depth below said substrate surface, said third depth being greater than said first depth but less than said second depth, thereby eliminating or at least substantially reducing roughness of the interfaces between the NiSi layers and the n-doped source and drain regions by minimizing the concentration of said As n-type dopant ions in said NiSi layers.

15. The method as in claim 14, comprising:

performing step (f) followed by step (g).

16. The method as in claim 14, comprising:

performing step (g) followed by step (f).

17. The method as in claim 14, wherein:

step (d) comprises forming said pair of n-type source and drain extension regions at a shallow depth of from about 100 to about 200 Å;

step (f) comprises implanting said P-containing or Sb-containing n-type dopant ions at a dosage and energy such that said first depth is from about 50 to about 150 Å below said substrate surface and said first peak dopant concentration is from about $1 \times 10^{20}$ to about $1 \times 10^{21}$ da/cm$^3$;

step (g) comprises implanting said As n-type dopant ions at a dosage and energy such that said second depth is from about 250 to about 450 Å below said substrate surface and said second peak dopant concentration is from about $5 \times 10^{19}$ to about $2 \times 10^{20}$ da/cm$^3$;

step (h) comprises forming a Ni layer having a thickness of from about 100 to about 200 Å; and step (i) comprises reacting said Ni layer with said Si substrate to form a NiSi layer extending to said third depth below said substrate surface of from about 180 to about 360 Å.

18. The method as in claim 17, wherein:

step (d) comprises implanting As n-type dopant ions at a dosage of from about $1 \times 10^{15}$ to about $2 \times 10^{15}$ da/cm$^2$ and energy of from about 2 to about 5 KeV;

step (f) comprises implanting said P-containing ions or said Sb-containing ions at a dosage of from about $3 \times 10^{15}$ to about $6 \times 10^{15}$ da/cm$^2$ and energy from about 5 to about 10 KeV for P-containing ions and from about 10 to about 25 Kev for Sb-containing ions;

step (g) comprises implanting said As ions at a dosage of from about $1 \times 10^{15}$ to about $2 \times 10^{15}$ da/cm$^2$ and energy of from about 35 to about 85 KeV; and step (i) comprises heating said Ni layer in an inert atmosphere at a temperature of from about 300 to about 550° C. for from about 30 to about 60 sec.

19. A semiconductor device, comprising:
(a) a Si semiconductor substrate having a surface;
(b) at least one n-type doped region formed in said substrate, said n-type doped region comprising:
  (i) implanted P-containing or Sb-containing n-type dopant ions, the concentration vs. depth profile of said implanted P-containing or Sb-containing dopant ions exhibiting a first peak dopant concentration at a first depth below said substrate surface; and
  (ii) implanted As n-type dopant ions, the concentration vs. depth profile of said As dopant ions exhibiting a second peak dopant concentration at a second depth below said substrate surface, said second depth being greater than said first depth and said second peak dopant concentration being less than said first peak dopant concentration; and
  (c) an electrically conductive NiSi layer extending from said substrate surface into said at least one n-type doped region to a third depth below said substrate surface, said third depth being greater than said first depth but less than said second depth, wherein said third depth being less than said second depth eliminates or at least substantially reduces roughness at the interface between the NiSi layer and the n-type doped layer by minimizing the concentration of As n-type dopant ions in said NiSi layer.

20. A semiconductor device as in claim 19, wherein said at least one n-type doped region is a source or drain region of a MOS transistor or a CMOS device.

* * * * *